US012633244B2

(12) United States Patent
Tseng et al.

(10) Patent No.: US 12,633,244 B2
(45) Date of Patent: May 19, 2026

(54) SHIFT REGISTER UNIT, GATE DRIVE CIRCUIT, AND DISPLAY DEVICE

(71) Applicant: Everdisplay Optronics (Shanghai) Co., Ltd., Shanghai (CN)

(72) Inventors: Ying-Hsiang Tseng, Shanghai (CN); Lina Xiao, Shanghai (CN); Qi Wang, Shanghai (CN); Jie Liu, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/698,031

(22) PCT Filed: Sep. 20, 2023

(86) PCT No.: PCT/CN2023/120004
§ 371 (c)(1),
(2) Date: Apr. 3, 2024

(87) PCT Pub. No.: WO2025/007428
PCT Pub. Date: Jan. 9, 2025

(65) Prior Publication Data
US 2026/0105877 A1     Apr. 16, 2026

(30) Foreign Application Priority Data
Jul. 5, 2023    (CN) .......................... 202310820939.1

(51) Int. Cl.
*G09G 3/20* (2006.01)
*G11C 19/28* (2006.01)
(52) U.S. Cl.
CPC ... *G09G 3/2092* (2013.01); *G09G 2310/0267* (2013.01); *G09G 2310/0286* (2013.01); *G11C 19/28* (2013.01)

(58) Field of Classification Search
CPC ......... G09G 3/2092; G09G 2310/0267; G09G 2310/0286; G11C 19/28
See application file for complete search history.

(56) References Cited

U.S. PATENT DOCUMENTS 8,564,523 B2 * 10/2013 Moon .................. G09G 3/3688
377/64
2008/0013670 A1 * 1/2008 Lo .......................... G11C 19/28
377/79

(Continued)

FOREIGN PATENT DOCUMENTS

| CN | 109147635 A | 1/2019 |
| CN | 105741749 B | 3/2019 |

(Continued)

OTHER PUBLICATIONS

International Search Report dated Mar. 20, 2024 of International Application No. PCT/CN2023/120004.

(Continued)

*Primary Examiner* — Cory A Almeida
(74) *Attorney, Agent, or Firm* — Qinghong Xu

(57) ABSTRACT

The present application provides a shift register unit, a drive circuit, and a display device. The shift register unit includes an input module, a first control module, a second control module, a third control module, a first output module, a second output module, a first capacitor, a second capacitor, and a third capacitor. The input module controls the potential at the first node, the first control module controls the potential at the second node, and the second control module and the third control module control the potential at the third node. One terminal of the first capacitor is connected to the first node. One terminal of the second capacitor is connected to the second node. One terminal of the third capacitor is connected to the third node.

20 Claims, 13 Drawing Sheets

(56)                       References Cited

U.S. PATENT DOCUMENTS

| | | | |
|---|---|---|---|
| 2009/0303211 A1* | 12/2009 | Hu | G11C 19/28 |
| | | | 377/68 |
| 2014/0111490 A1 | 4/2014 | Lee et al. | |
| 2014/0168048 A1* | 6/2014 | Shao | G09G 3/3677 |
| | | | 377/64 |
| 2015/0043703 A1* | 2/2015 | Tan | G11C 19/184 |
| | | | 377/68 |
| 2015/0255031 A1* | 9/2015 | Cao | G09G 3/3677 |
| | | | 345/210 |
| 2016/0266699 A1* | 9/2016 | Zhao | G09G 3/3677 |
| 2020/0258439 A1* | 8/2020 | Li | G09G 3/3266 |
| 2021/0200351 A1 | 7/2021 | Yang et al. | |

FOREIGN PATENT DOCUMENTS

| | | | |
|---|---|---|---|
| CN | 109616056 A | 4/2019 | |
| CN | 110164352 A | 8/2019 | |
| CN | 111754915 A | 10/2020 | |
| CN | 111883067 A | 11/2020 | |
| CN | 111933083 A | 11/2020 | |
| CN | 112802422 A | 5/2021 | |
| CN | 112951163 A | 6/2021 | |
| CN | 113838408 A | 12/2021 | |
| CN | 116229904 A | 6/2023 | |
| CN | 116805470 A | 9/2023 | |
| JP | 2015060100 A | 3/2015 | |

OTHER PUBLICATIONS

1st Office Action dated Nov. 26, 2025 of Chinese Application No. 202310820939.1.

* cited by examiner

SHIFT REGISTER UNIT, GATE DRIVE CIRCUIT, AND DISPLAY DEVICE

CROSS REFERENCE TO RELATED APPLICATION(S)

The present application is a 35 U.S.C. 371 national phase application of PCT International Application No. PCT/CN2023/120004 filed on Sep. 20, 2023, which claims the priority to Chinese Application No. 202310820939.1 filed on Jul. 5, 2023, both of which are incorporated herein by reference in their entireties as part of the present application for all the purposes.

TECHNICAL FIELD

The present application relates to the field of display technology, and in particular to a shift register unit, a gate drive circuit, and a display device.

BACKGROUND

The display device not only includes a display panel, but also includes a gate driver circuit (also called row drive circuit) and a source drive circuit (also called column drive circuit or Source Driver) with a pixel array that controls the display panel for display. The display panel adopts a display mode based on row-by-row scanning, in which the gate drive circuit is used to generate scan signals to turn on each row of pixels in turn, while the source drive circuit is used to provide data signals to a row of pixels when they are turned on for the purpose of achieving the pixel display.

The gate drive circuit includes a shift register, which includes multiple cascaded shift register units. The shift register unit at each stage is usually mainly composed of several transistors. By inputting a clock signal and an input signal (that is, start pulse signal) to the circuit, a level signal is outputted at the output terminal.

The Chinese patent No. CN105741749B discloses a shift register unit. FIG. 1 shows the voltage waveform diagram at the fourth node N4 in the shift register unit in the Chinese patent No. CN105741749B, where the abscissa is time and the ordinate is voltage. As shown in FIG. 1, the voltage at node N4 will switch with the high and low levels of the clock signal c1, synchronously forming the upward and downward waveforms shown in the dotted box. There is a risk point in this circuit. That is, when the clock signal c1 is pulled down to an excessive degree, the transistor M2 will be turned on abnormally. This would result in abnormal signal output at the output terminal of the shift register unit, causing an abnormal screen display.

SUMMARY

In view of the problems in the related art, the purpose of the present application is to provide a shift register unit, a gate drive circuit, and a display device. The provided shift register unit helps to optimize the waveform of the output signal and avoid abnormal signal output of the shift register unit, thereby avoiding abnormal display of the display screen.

An embodiment of the present invention provides a shift register unit, including:

an input module, configured to transmit a signal at an input terminal to a first node in response to a first clock signal;

a first control module, configured to: transmit a first voltage signal to a second node in response to the first clock signal; and transmit the first clock signal to the second node in response to the signal at the input terminal;

a second control module, configured to transmit the first voltage signal to a third node in response to a second clock signal;

a third control module, configured to transmit a second voltage signal to the third node in response to a signal at the first node;

a first output module, configured to transmit the second voltage signal to an output terminal in response to a signal at the third node;

a second output module, configured to transmit the first voltage signal to the output terminal in response to the signal at the first node;

a first capacitor connected between the first node and the second voltage signal lead;

a second capacitor connected between a second clock signal lead and the second node; and a third capacitor connected between a second voltage signal lead and the third node.

In some embodiments, the input module includes a first transistor. The control terminal of the first transistor is connected to the first clock signal lead. The first terminal of the first transistor is connected to the input terminal. The second terminal of the first transistor is connected to the first node.

In some embodiments, the input module further includes a second transistor. The control terminal of the second transistor is connected to the first voltage signal lead. The first terminal of the second transistor is connected to the second terminal of the first transistor. The second terminal of the second transistor is connected to the first node.

In some embodiments, the input module includes a third transistor. The control terminal of the third transistor is connected to the second node. The first terminal of the third transistor is connected to the second voltage signal lead. The second terminal of the third transistor is connected to the first terminal of the first capacitor.

In some embodiments, the input module further includes a fourth transistor and a fifth transistor. The control terminal of the fourth transistor is connected to the second clock signal lead. The first terminal of the fourth transistor is connected to the second clock signal lead. The second terminal of the fourth transistor is connected to the first terminal of the fifth transistor.

The control terminal of the fifth transistor is connected to the second node. The second terminal of the fifth transistor is connected to the first node.

In some embodiments, the first control module includes a sixth transistor. The control terminal of the sixth transistor is connected to the first clock signal lead. The first terminal of the sixth transistor is connected to the first voltage signal lead. The second terminal of the sixth transistor is connected to the second node.

In some embodiments, the first control module further includes a seventh transistor. The control terminal of the seventh transistor is connected to the first voltage signal lead. The first terminal of the seventh transistor is connected to the second node. The second terminal of the seventh transistor is connected to the second terminal of the second capacitor.

In some embodiments, the first control module further includes an eighth transistor. The control terminal of the eighth transistor is connected to the input terminal. The first terminal of the eighth transistor is connected to the first clock signal lead. The second terminal of the eighth transistor is connected to the second node.

In some embodiments, the second control module includes a ninth transistor. The control terminal of the ninth transistor is connected to the first terminal of the second capacitor and the second clock signal lead. The first terminal of the ninth transistor is connected to the first voltage signal lead. The second terminal of the ninth transistor is connected to the third node.

In some embodiments, the second control module further includes a tenth transistor. The control terminal of the tenth transistor is connected to the second terminal of the second capacitor. The first terminal of the tenth transistor is connected to the second terminal of the ninth transistor. The second terminal of the tenth transistor is connected to the third node.

In some embodiments, the third control module includes an eleventh transistor. The control terminal of the eleventh transistor is connected to the first node. The first terminal of the eleventh transistor is connected to the second voltage signal lead. The second terminal of the eleventh transistor is connected to the third node.

In some embodiments, a twelfth transistor is further included. The control terminal of the twelfth transistor is connected to the first node. The first terminal of the twelfth transistor is connected to the second clock signal lead. The second terminal of the twelfth transistor is connected to the second terminal of the first capacitor.

In some embodiments, the first output module includes a thirteenth transistor. The control terminal of the thirteenth transistor is connected to the third node. The first terminal of the thirteenth transistor is connected to the second voltage signal lead. The second terminal of the thirteenth transistor is connected to the output terminal.

The second output module includes a fourteenth transistor. The control terminal of the fourteenth transistor is connected to the first node. The first terminal of the fourteenth transistor is connected to the first voltage signal lead. The control terminal of the fourteenth transistor is connected to the output terminal.

An embodiment of the present application also provides a gate drive circuit, including the shift register unit as described above.

An embodiment of the present application also provides a display device, including the gate drive circuit as described above.

The shift register unit, gate drive circuit, and display device provided by the present application have the following advantages.

The shift register unit provided by the present application optimizes the voltage waveform at the first node and thus optimizes the output signal waveform of the shift register unit, thereby avoiding abnormal signal output of the shift register unit and abnormal display of pictures.

BRIEF DESCRIPTION OF THE DRAWINGS

Other features, objects, and advantages of the present application will become more apparent upon reading the detailed description of the non-limiting embodiments with reference to the following drawings.

DETAILED DESCRIPTION OF THE EMBODIMENTS

Figure 1:
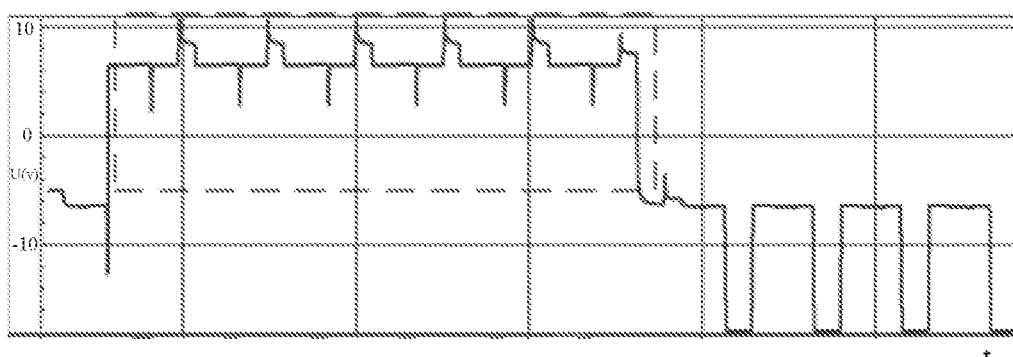
FIG. 1 is a voltage waveform diagram at the fourth node of a shift register unit in the related art.

Example embodiments will now be described more fully with reference to the accompanying drawings. Example embodiments may, however, be embodied in various forms and should not be construed as limited to the embodiments set forth herein. Rather, these embodiments are provided so that the present disclosure will be thorough and complete, and will fully convey the concepts of the example embodiments to those skilled in the art. The same reference numerals in the drawings represent the same or similar structures, and thus their repeated description will be omitted. The words "or" in the description may indicate "and" or "or".

In this specification, references to the terms "one embodiment", "some embodiments", "an example", "a specific example", or "some examples" or the like are intended to indicate that the specific features, structures, materials, or characteristics represented in conjunction with this/these embodiment(s) or example(s) are included in at least one embodiment or example of the present application. Furthermore, the specific features, structures, materials, or characteristics illustrated may be combined in any suitable manner in any one or more embodiments or examples. Furthermore, those skilled in the art may incorporate and combine different embodiments or examples represented in the present application and the features in different embodiments or examples, unless they are inconsistent with each other.

In addition, the terms "first" and "second" are only used for expression purposes and cannot be understood as indicating or implying relative importance or implicitly indicating the number of the indicated technical features. Thus, features defined as "first" and "second" may explicitly or implicitly include at least one of these features. Throughout the expressions in the present application, the wording "plurality of" means two or more than two, unless otherwise expressly and specifically limited.

The transistors used in embodiments of the present application may be thin film transistors, field effect transistors, or other devices with the same characteristics. Transistors may be divided into N-type and P-type transistors according to their characteristics. In the following embodiments, P-type transistors are used for explanation. In an embodiment of the present application, the control terminal is the gate, the first terminal is the source, and the second terminal is the drain. When a low level is inputted at the gate of the P-type transistor, the source and the drain are turned on. It should be noted here that in an embodiment of the present application, all transistors are P-type transistors for the purpose of example illustrations. In this case, the working level refers to the effective level at which the P-type transistor turns on, that is, low level, and the non-working level refers to high level.

Figure 2:
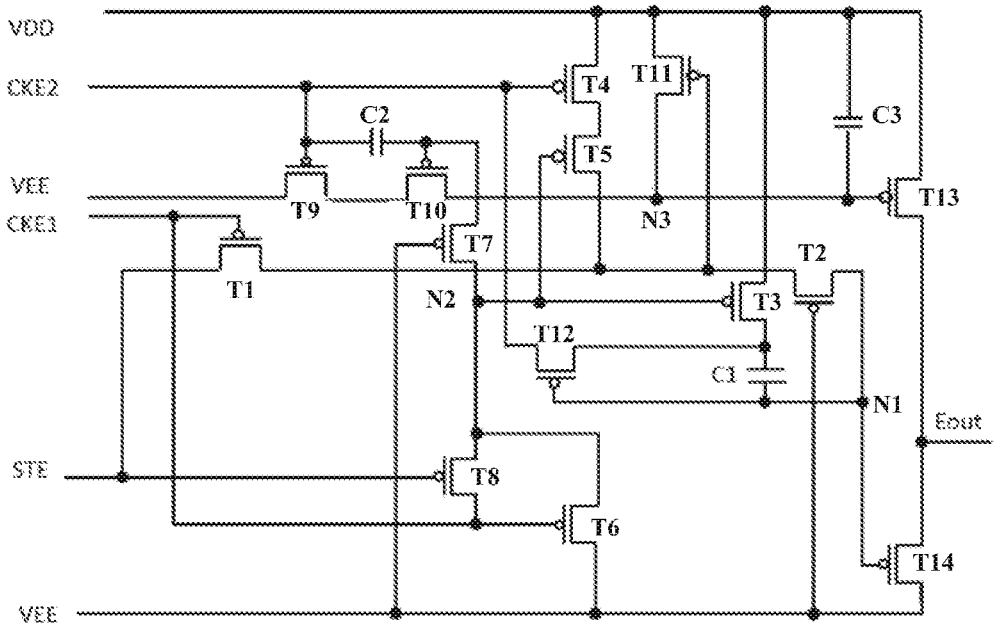
FIG. 2 is a schematic circuit diagram of a shift register unit provided by an embodiment of the present application.

In order to solve the problems of the related art, the present application provides a shift register unit, as shown in FIG. 2. The shift register unit includes an input module, a first control module, a second control module, a third control module, a first output module, a second output module, a first capacitor C1, a second capacitor C2, and a third capacitor C3.

The input module is configured to transmit the signal STE at the input terminal to the first node N1 in response to the first clock signal CKE1.

The first control module is configured to: transmit the first voltage signal VEE to the second node N2 in response to the first clock signal CKE1; and transmit the first clock signal CKE1 to the second node N2 in response to the signal STE at the input terminal.

The second control module is configured to transmit the first voltage signal VEE to the third node N3 in response to the second clock signal CKE2.

The third control module is configured to transmit the second voltage signal VDD to the third node N3 in response to the signal at the first node N1.

The first output module is configured to transmit the second voltage signal VDD to the output terminal in response to the signal at the third node N3.

The second output module is configured to transmit the first voltage signal VEE to the output terminal in response to the signal at the first node N1.

The first capacitor C1 is connected between the first node N1 and the second voltage signal lead.

The second capacitor C2 is connected between the second clock signal lead and the second node.

The third capacitor C3 is connected between the second voltage signal lead and the third node.

The first voltage signal VEE is a low-level signal. The second voltage signal VDD is a high-level signal. The first clock signal and the second clock signal are pulse signals with the same frequency and opposite phases.

Continued references may be made to FIG. 2. Specifically, the input module includes a first transistor T1. The control terminal of the first transistor T1 is connected to the first clock signal lead. The first terminal of the first transistor T1 is connected to the input terminal. The second terminal of the first transistor T1 is connected to the first node N1.

The input module also includes a second transistor T2. The control terminal of the second transistor T2 is connected to the first voltage signal lead. The first terminal of the second transistor T2 is connected to the second terminal of the first transistor T1. The second terminal of the second transistor T2 is connected to the first node N1.

The input module includes a third transistor T3. The control terminal of the third transistor T3 is connected to the second node. The first terminal of the third transistor T3 is connected to the second voltage signal lead. The second terminal of the third transistor T3 is connected to the first terminal of the first capacitor C1.

The input module also includes a fourth transistor T4 and a fifth transistor T5. The control terminal of the fourth transistor T4 is connected to the second clock signal lead. The first terminal of the fourth transistor T4 is connected to the second voltage signal lead. The second terminal of the fourth transistor T4 is connected to the first terminal of the fifth transistor T5.

The control terminal of the fifth transistor T5 is connected to the second node N2. The second terminal of the fifth transistor T5 is connected to the first node N1.

The first control module includes a sixth transistor T6. The control terminal of the sixth transistor T6 is connected to the first clock signal lead. The first terminal of the sixth transistor T6 is connected to the first voltage signal lead. The second terminal of the sixth transistor T6 is connected to the second node N2.

The first control module also includes a seventh transistor T7. The control terminal of the seventh transistor T7 is connected to the first voltage signal lead. The first terminal of the seventh transistor T7 is connected to the second node N2. The second terminal of the seventh transistor T7 is connected to the second terminal of the second capacitor C2.

The first control module further includes an eighth transistor T8. The control terminal of the eighth transistor T8 is connected to the input terminal. The first terminal of the eighth transistor T8 is connected to the first clock signal lead. The second terminal of the eighth transistor T8 is connected to the second node N2.

The second control module includes a ninth transistor T9. The control terminal of the ninth transistor T9 is connected to the first terminal of the second capacitor C2 and the second clock signal lead. The first terminal of the ninth transistor T9 is connected to the first voltage signal lead. The second terminal of the ninth transistor T9 is connected to the third node N3.

The second control module also includes a tenth transistor T10. The control terminal of the tenth transistor T10 is connected to the second terminal of the second capacitor C2 and the second terminal of the seventh transistor T7. The first terminal of the tenth transistor T10 is connected to the second terminal of the ninth transistor T9. The second terminal of the tenth transistor T10 is connected to the third node N3.

The third control module includes an eleventh transistor T11. The control terminal of the eleventh transistor T11 is connected to the first node N1. The first terminal of the eleventh transistor T11 is connected to the second voltage signal lead. The second terminal of the eleventh transistor T11 is connected to the third node N3.

The shift register unit further includes a twelfth transistor T12. The control terminal of the twelfth transistor T12 is connected to the first node N1. The first terminal of the twelfth transistor T12 is connected to the second clock signal lead. The second terminal of the twelfth transistor T12 is connected to the second terminal of the first capacitor C1.

The first output module includes a thirteenth transistor T13. The control terminal of the thirteenth transistor T13 is connected to the third node N3. The first terminal of the thirteenth transistor T13 is connected to the second voltage signal lead. The second terminal of the thirteenth transistor T13 is connected to the output terminal.

The second output module includes a fourteenth transistor T14. The control terminal of the fourteenth transistor T14 is connected to the first node N1. The first terminal of the fourteenth transistor T14 is connected to the first voltage signal lead. The second terminal of the fourteenth transistor T14 is connected to the output terminal.

Figure 3:
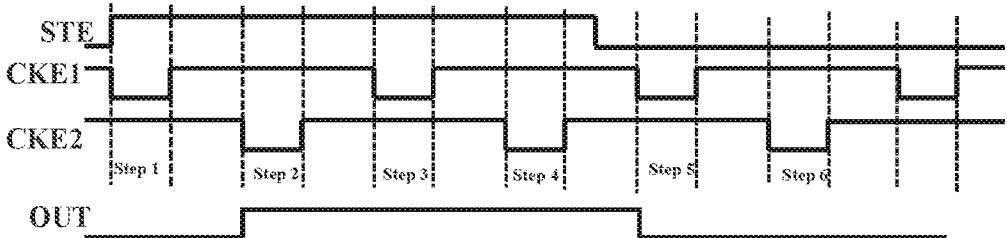
FIG. 3 is a timing diagram of a shift register unit according to an embodiment of the present application.

FIG. 3 shows a timing diagram of the shift register unit. The working principle of the shift register unit is explained with reference to FIG. 3. It should be noted that, for ease of understanding, high-level signals are represented by "H" and low-level signals are represented by "L" in the drawings.

Figure 4:
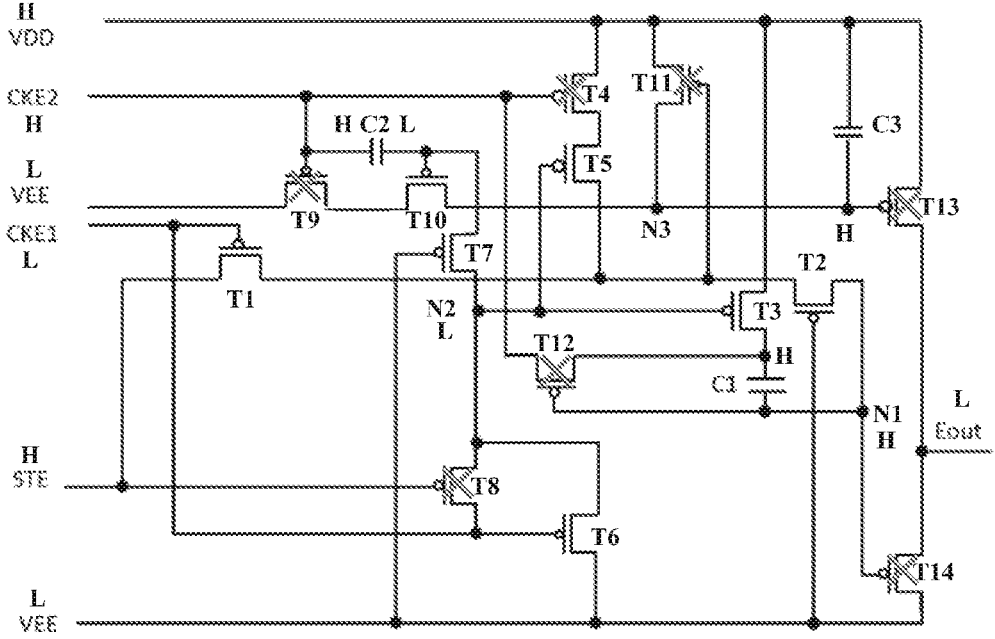
FIGS. 4 to 9 are schematic circuit diagrams showing the on/off control in the shift register unit in FIG. 2 during each step.

FIG. 4 shows a schematic circuit diagram showing the on/off control in the shift register unit during the first step Step1. As shown in FIG. 4, the signal STE at the input terminal is high level, the first clock signal CKE1 is low level, and the second clock signal CKE2 is high level. When the signal STE is high level, the eighth transistor T8 is turned off. When the second clock signal CKE2 is high level, the fourth transistor T4 and the ninth transistor T9 are turned off. When the first clock signal CKE1 is low level, the first transistor T1 and the sixth transistor T6 are turned on. The first voltage signal VEE is a continuous low level signal. Therefore, the second transistor T2 and the seventh transistor T7 are always in an on state. The first transistor T1 and the second transistor T2 are turned on. The high-level input signal STE is transmitted to the first node N1 through the first transistor T1 and the second transistor T2. At this time, the first node N1 is at a high level. The high-level first node N1 keeps the twelfth transistor T12 and the fourteenth transistor T14 off at this stage. The sixth transistor T6 and the seventh transistor T7 are turned on. The first voltage signal VEE is transmitted to the second node N2 through the sixth transistor T6 and the seventh transistor T7. The second node N2 is connected to the second terminal of the second capacitor C2. The second clock signal CKE2 is connected to the first terminal of the second capacitor C2. Under the action of the second clock signal CKE2 and the first voltage signal VEE, the second capacitor C2 is charged, where the first terminal of the second capacitor C2 is at a high level, and the second terminal of the second capacitor C2 is at a low level. When the second node N2 is at a low level, the third transistor T3, the fifth transistor T5, and the tenth transistor T10 are turned on. The second voltage signal VDD is transmitted to the first terminal of the first capacitor C1 through the third transistor T3. At this time, both the first terminal of the first capacitor C1 and the second terminal of the first capacitor C1 are at a high level. At the previous moment, the thirteenth transistor T13 was in an off state. Therefore, in the first step Step1, neither the first output module nor the second output module of the shift register unit outputs a signal, and the signal Eout at the output terminal remains at a low potential at the previous moment.

Figure 5:
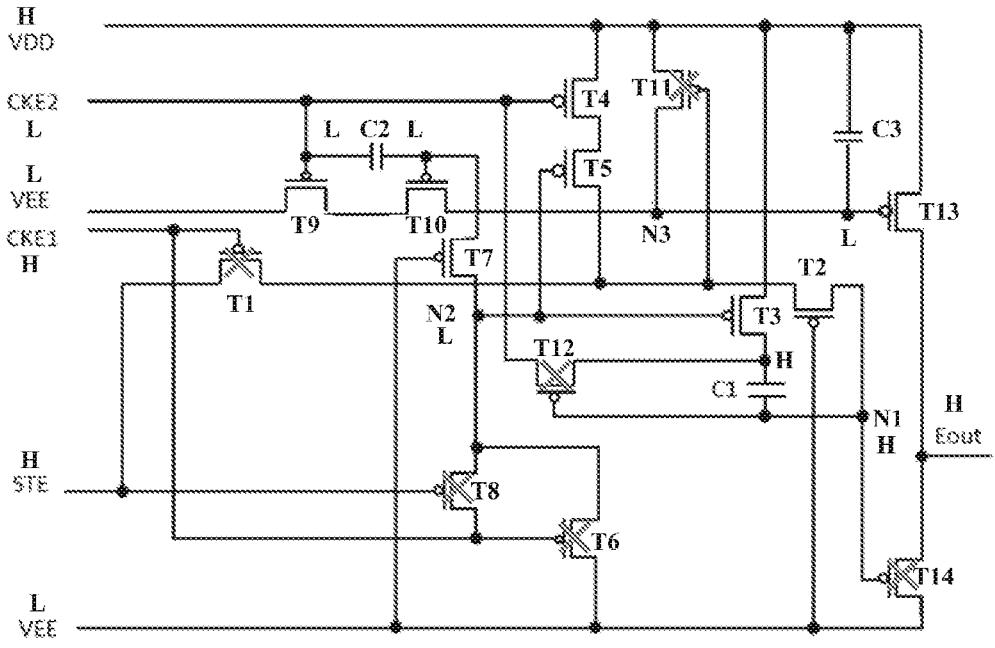

FIG. 5 shows a schematic circuit diagram showing the on/off control in the shift register unit during the first step Step2. At this time, the first clock signal CKE1 is high level, the second clock signal CKE2 is low level, the signal STE at the input terminal is high level, and the second node N2 remains at a low level under the action of the second capacitor C2. The principle is the same as in Step 1. When the first clock signal CKE1 is high level, the first transistor T1 and the sixth transistor T6 are turned off. When STE is high level, the eighth transistor T8 is turned off. When the second clock signal CKE2 is low level and the second node N2 is also at a low level, the third transistor T3, the fourth transistor T4, and the fifth transistor T5 are turned on, and the second voltage signal VDD is transmitted to the first node N1. At this time, the first node N1 may still be at a high level. Thus, the eleventh transistor T11, the twelfth transistor T12, and the fourteenth transistor T14 are turned off. Under the low-level effect of the second clock signal CKE2 and the second node N2, the first voltage signal VEE is transmitted to the third node N3 and the third capacitor C3 is charged. The first terminal of the third capacitor C3 is at a high level. The second terminal of the third capacitor C3 is at a low level. The third node N3 is at a low level at this time. The thirteenth transistor T13 is then turned on. The second voltage signal VDD is transmitted to the output terminal through the thirteenth transistor T13. The signal Eout output at the output terminal is a high-level signal VDD.

The potential at the first node N1 that controls the on or off state of the fourteenth transistor T14 will continue to receive the high-level signal VDD transmitted through the fourth transistor T4 and the fifth transistor T5 during the Step 2 stage. The first terminal of the first capacitor C1 continues to transmit the high-level signal VDD through the third transistor T3. Thus, when the first node N1 is working in the Step 2 stage, it continues to remain at a high level without any pull-down effect, and the fourteenth transistor can be controlled to remain in the off state in the Step 2 stage.

Figure 6:
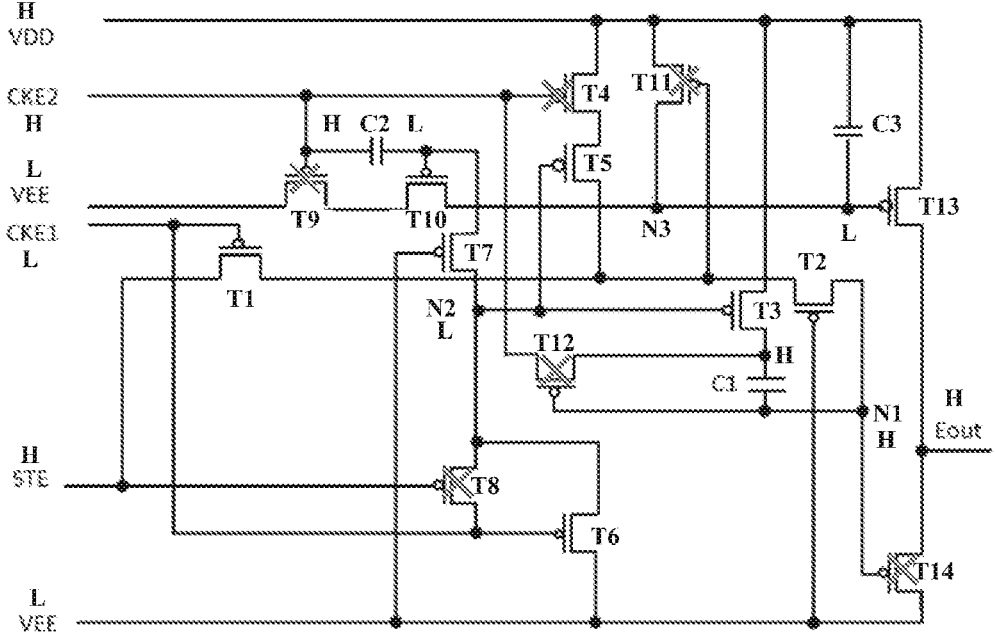

FIG. 6 shows a schematic circuit diagram showing the on/off control in the shift register unit during the third step Step3. At this moment, the first clock signal CKE1 is a low-level signal, the second clock signal CKE2 is a high-level signal, and the signal STE at the input terminal is a high-level signal. The working principle is the same as in Step 1 and will not be described again here. At this moment, the first transistor T1, the second transistor T2, the third transistor T3, the fifth transistor T5, the sixth transistor T6, the seventh transistor T7, the tenth transistor T10, and the thirteenth transistor T13 are turned on. The fourth transistor T4, the eighth transistor T8, the ninth transistor T9, the eleventh transistor T11, the twelfth transistor T12, and the fourteenth transistor T14 are turned on. The high-level input signal STE is transmitted to the first node N1 through the first transistor T1 and the second transistor T2. The potential at the second node N2 is low level. The potential at the third node N3 is low level under the action of the third capacitor C3. Therefore, the second voltage signal VDD is transmitted to the output terminal through the thirteenth transistor. The signal Eout output at the output terminal is a high-level signal VDD.

The first node N1 continues to remain at a high level during the Step 3 stage without any pull-down effect, and the fourteenth transistor can be controlled to remain in an off state during the Step 3 stage.

Figure 7:
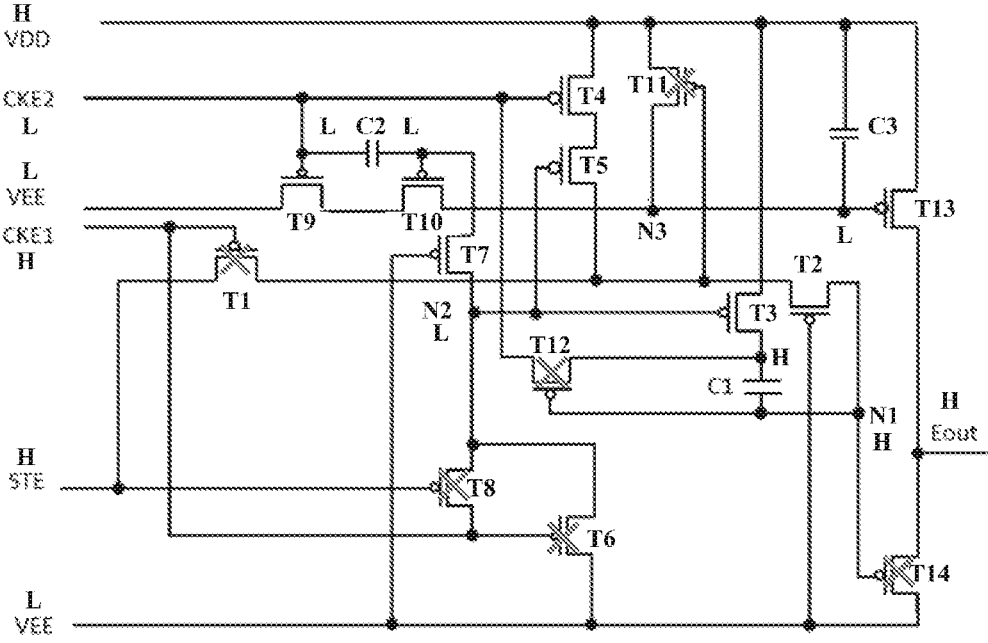

FIG. 7 shows a schematic circuit diagram showing the on/off control in the shift register unit during the fourth step Step 4. At this moment, the first clock signal CKE1 is a high-level signal, the second clock signal CK2 is a low-level signal, and the signal STE at the input terminal is a high-level signal. The working principle is the same as in Step 1 and will not be described again here. At this moment, the second transistor T2, the third transistor T3, the fourth transistor T4, the fifth transistor T5, the seventh transistor T7, the ninth transistor T9, the tenth transistor T10, the twelfth transistor T12, and the thirteenth transistor T13 are turned on. The first transistor T1, the sixth transistor T6, the eighth transistor T8, the eleventh transistor T11, and the fourteenth transistor T14 are turned off. At this moment, the high-level signal VDD is output constantly through the fourth transistor T4 and the fifth transistor T5 to the first node N1. The potential at the second node N2 is low level. The potential at the third node N3 is low level. The second voltage signal VDD is transmitted to the output terminal through the thirteenth transistor T13. The signal Eout output at the output terminal is a high-level signal VDD.

The first node N1 continues to remain at a high level during the Step 4 stage without any pull-down effect, and the fourteenth transistor can be controlled to remain in an off state during the Step 4 stage.

Figure 8:
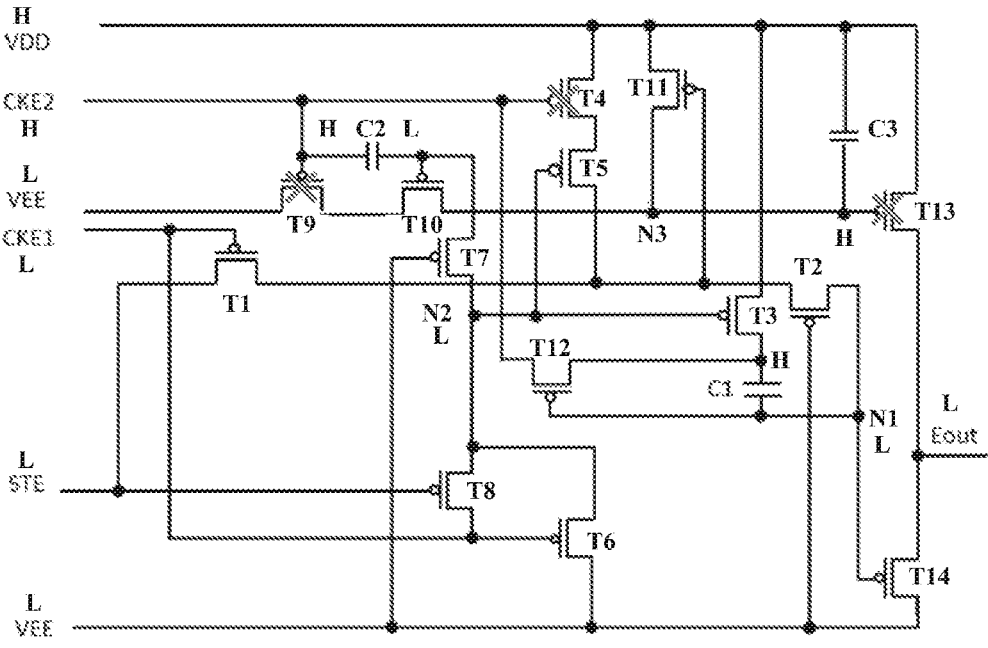

FIG. 8 shows a schematic circuit diagram showing the on/off control in the shift register unit during the fifth step Step5. At this moment, the first clock signal CKE1 is a low-level signal, the second clock signal CKE2 is a high-level signal, and the signal STE at the input terminal is a low-level signal. The principle is the same as in Step 1 and will not be repeated here. At this time, the first transistor T1, the second transistor T2, the third transistor T3, the fifth transistor T5, the sixth transistor T6, the seventh transistor T7, the eighth transistor T8, the tenth transistor T10, the eleventh transistor T11, the twelfth transistor T12, and the fourteenth transistor T14 are turned on. The fourth transistor T4, the ninth transistor T9, and the thirteenth transistor T13 are turned off. At this moment, the first node N1 is at a low level, the second node is at a low level, and the third node is at a high level. The first voltage signal VEE is transmitted to the output terminal through the fourteenth transistor T14. The signal Eout output at the output terminal is a low-level signal VEE.

Figure 9:
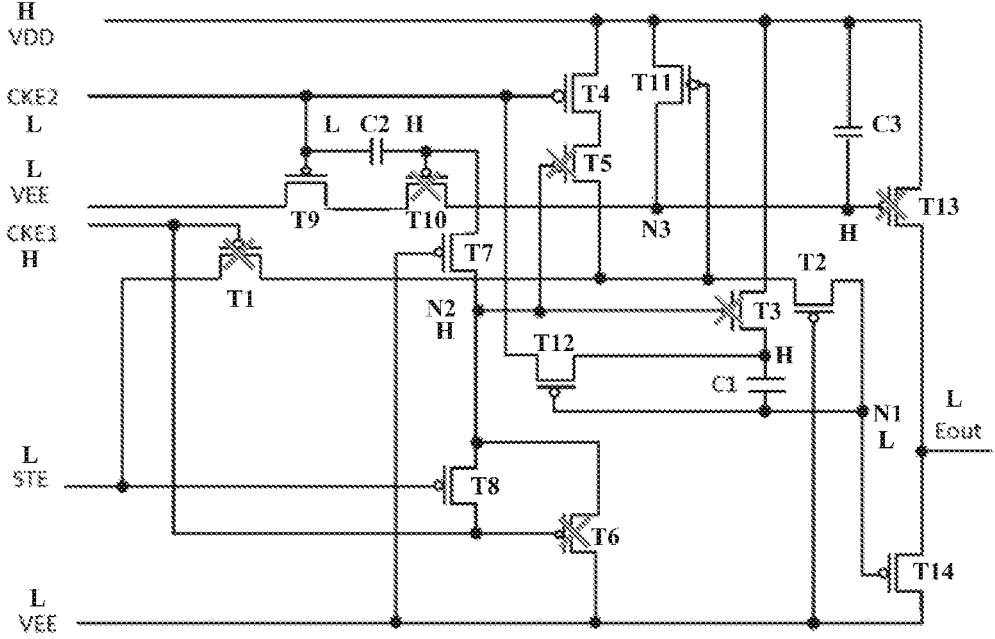

FIG. 9 shows a schematic circuit diagram showing the on/off control in the shift register unit during the sixth step Step 6. At this moment, the first clock signal CKE1 is a high-level signal, the second clock signal CKE2 is a low-level signal, and the signal STE at the input terminal is a low-level signal. The principle is the same as in Step 1 and will not be repeated here. At this moment, the first transistor T1, the third transistor T3, the fifth transistor T5, the sixth transistor T6, the tenth transistor T10, and the thirteenth transistor T13 are turned off. The second transistor T2, the fourth transistor T4, the seventh transistor T7, the eighth transistor T8, the ninth transistor T9, the eleventh transistor T11, the twelfth transistor T12, and the fourteenth transistor T14 are turned on. At this moment, the first node N1 is at a low level, the second node N2 is at a high level, and the third node N3 is at a high level. The first voltage signal VEE is transmitted to the output terminal through the fourteenth transistor T14. The signal Eout output at the output terminal is a low-level signal VEE.

The shift register unit repeats the fifth step Step5 and the sixth step Step6 in the subsequent working steps, which will not be repeated here, until the Step1 to Step4 working steps are started again when the next frame starts to be displayed.

Figure 10:
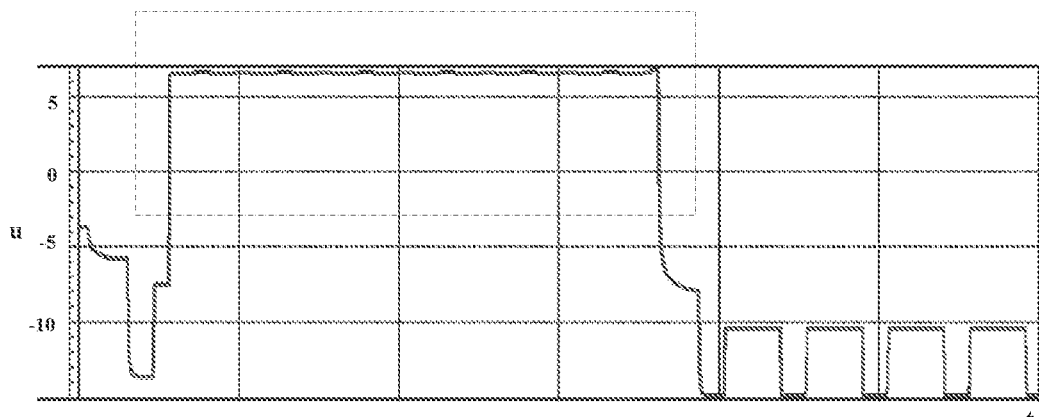
FIG. 10 is a signal waveform diagram output at the first node N1 in the shift register unit in FIG. 2.

In order to further explore the technical effects achieved by the shift register unit provided by embodiments of the present application, a simulation experiment was used to test the voltage waveform at the first node N1 during operation. FIG. 10 shows the voltage waveform at the first node N1 during the operation stage. As shown in FIG. 10, when the shift register unit outputs a high-level signal (the dotted box shown in FIG. 10), the voltage waveform output at the first node N1 has no obvious pull-down waveform. Thus, the fourteenth transistor T14 will not be caused to turn on abnormally, and abnormal signal output will not be caused from the shift register unit.

Figure 11:
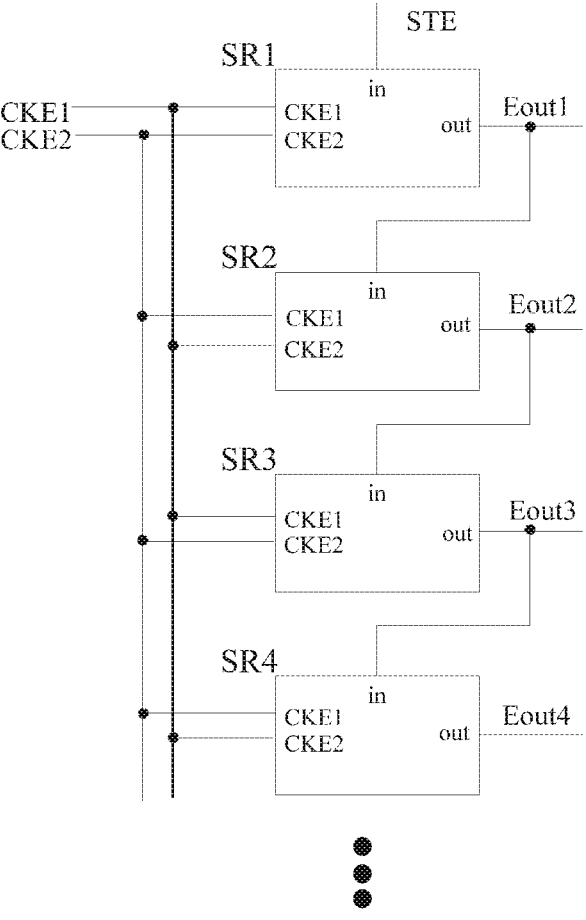
FIG. 11 is a schematic diagram of a gate drive circuit provided by an embodiment of the present application.

As shown in FIG. 11, an embodiment of the present invention also provides a gate drive circuit, including the shift register unit as described above. A plurality of shift register units are electrically connected in a cascade manner. The input terminal in of the shift register unit at the first stage is connected to the start pulse signal STE. Except for the shift register unit at the last stage, the output terminal out of the shift register unit at each other stage is connected to the input terminal in of the shift register unit at the next stage.

Specifically, in FIG. 11, four cascaded shift register units are taken as an example. The input signal STE at the input terminal in of the first-stage shift register unit SR1 is the start pulse signal. The output signal Eout1 at the output terminal out of the first-stage shift register unit SR1 serves as the input signal of the second-stage shift register unit SR2. The output terminal out of the first-stage shift register unit SR1 is connected to the input terminal in of the second-stage shift register unit SR2. The output signal Eout2 of the second-stage shift register unit SR2 serves as the input signal of the third-stage shift register unit SR3. The output terminal out of the second-stage shift register unit SR2 is connected to the input terminal in of the third-stage shift register unit SR3. The output signal Eout3 of the third-stage shift register unit SR3 serves as the input signal of the fourth-stage shift register unit SR4. The output terminal out of the third-stage shift register unit SR3 is connected to the input terminal in of the fourth-stage shift register unit SR4, and so on. Thereby, a gate drive circuit is formed.

As shown in FIG. 11, the gate drive circuit also includes a clock signal generating unit (not shown in the figure). The clock signal generating unit is used to generate the first clock signal CKE1 and the second clock signal CKE2. Specifically, the first clock signal CKE1 and the second clock signal CKE2 in the first-stage shift register unit SR1 are respectively the first clock signal CKE1 and the second clock signal CKE2 generated by the clock signal generating unit. The first clock signal CKE1 and the second clock signal CKE2 in the second-stage shift register unit SR2 are respectively the second clock signal CKE2 and the first clock signal CKE1 generated by the clock signal generating unit. The first clock signal CKE1 and the second clock signal CKE2 in the third-stage shift register unit SR3 are respectively the first clock signal CKE1 and the second clock signal CKE2 generated by the clock signal generating unit. The first clock signal CKE1 and the second clock signal CKE2 in the fourth-stage shift register unit SR4 are respectively the first clock signal CKE1 and the second clock signal CKE2 generated by the clock signal generating unit. In a similar way, the first clock signal CKE1 and the second clock signal CKE2 in the n-th stage shift register unit SRn are respectively the first clock signal CKE1 and the second clock signal CKE2 generated by the clock signal generating unit. The first clock signal CKE1 and the second clock signal CKE2 in the (n+1)-th stage shift register unit SRn+1 are respectively the second clock signal CKE2 and the first clock signal CKE1 generated by the clock signal generating unit.

Figure 12:
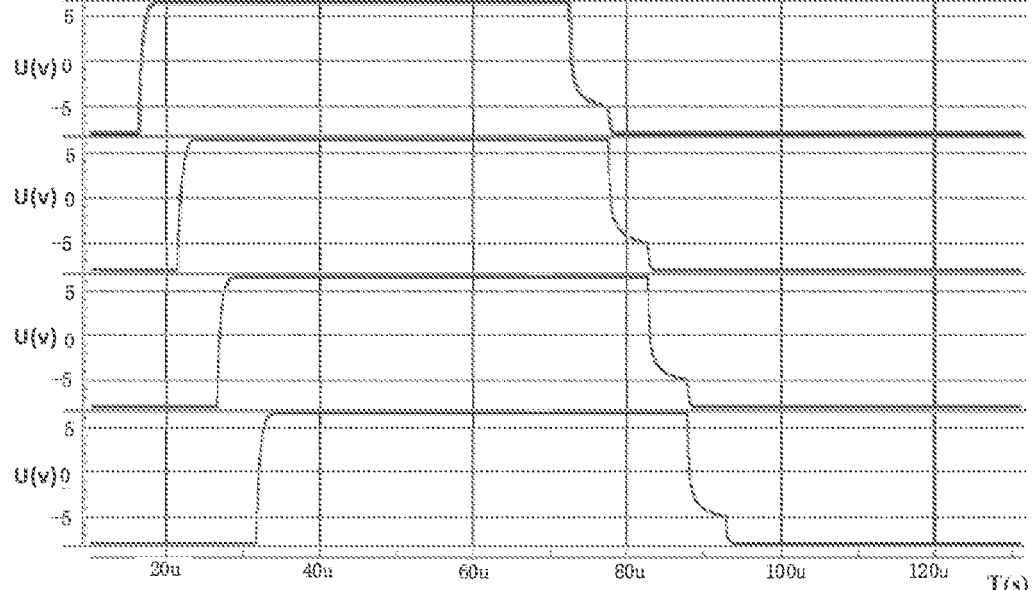
FIG. 12 is a signal waveform diagram output by the gate drive circuit in FIG. 11.

FIG. 12 shows the signal waveform diagram output by the four stages of shift register units in the gate drive circuit shown in FIG. 11. As shown in FIG. 12, the voltage waveform output by the four stages of shift register units is normal and effective, which will not cause abnormal display of the display screen.

An embodiment of the present invention also provides a display device, including the gate drive circuit as described above. The signal output from the shift register unit is used to turn on the gate scanning lines in the display device row by row. That is, the signal output by the output signal terminal of each shift register unit is the signal for the gate scanning line of each row of pixel units. Further, the display device further includes a source drive circuit, which is used for providing data voltage to the respective pixel unit when the gate scanning line is turned on.

Figure 13:
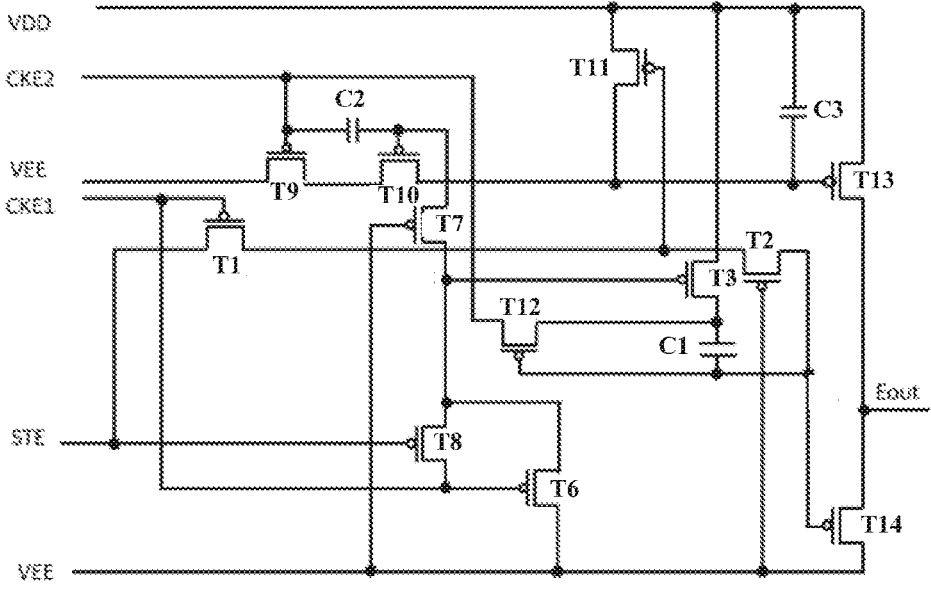
FIG. 13 is a schematic circuit diagram of a shift register unit according to another embodiment of the present application.

As shown in FIG. 13, another embodiment of the present application provides a shift register unit. Compared with the shift register unit shown in FIG. 2, the shift register unit in FIG. 13 does not include the fourth transistor T4 and the fifth transistor T5, but can implement the same technical effect as the shift register unit in the embodiment of FIG. 2. However, due to the reduction in the number of transistors in the shift register unit, the circuit layout area is reduced, which in turn helps to reduce the frame size of the OLED screen and achieve a narrow frame effect of the display device.

The shift register unit, the gate drive circuit, and the display device provided by the present application have the following advantages.

The shift register unit provided by the present application optimizes the output signal waveform of the shift register unit by optimally controlling the voltage waveform at the first node, thereby avoiding abnormal signal output of the shift register unit and abnormal display of pictures.

The above content is a further detailed description of the present application in combination with specific preferred embodiments, which cannot be concluded that the specific implementation of the present application is limited to these descriptions. For those of ordinary skill in the technical field to which the present application belongs, several simple deductions or substitutions can be made without departing from the concept of the present application, and all of them should be regarded as belonging to the protection scope of the present application.

The invention claimed is:

1. A shift register unit, comprising:
an input module, configured to transmit a signal at an input terminal to a first node in response to a first clock signal;
a first control module, configured to: transmit a first voltage signal to a second node in response to the first clock signal; and transmit the first clock signal to the second node in response to the signal at the input terminal;
a second control module, configured to transmit the first voltage signal to a third node in response to a second clock signal;
a third control module, configured to transmit a second voltage signal to the third node in response to a signal at the first node;
a first output module, configured to transmit the second voltage signal to an output terminal in response to a signal at the third node;
a second output module, configured to transmit the first voltage signal to the output terminal in response to the signal at the first node;
a first capacitor connected between the first node and a second voltage signal lead;
a second capacitor connected between a second clock signal lead and the second node; and
a third capacitor connected between the second voltage signal lead and the third node.

2. The shift register unit according to claim 1, wherein the input module comprises a first transistor, where a control terminal of the first transistor is connected to a first clock signal lead, a first terminal of the first transistor is connected to the input terminal, and a second terminal of the first transistor is connected to the first node.

3. The shift register unit according to claim 2, wherein the input module further comprises a second transistor, where a control terminal of the second transistor is connected to a first voltage signal lead, a first terminal of the second transistor is connected to the second terminal of the first transistor, and a second terminal of the second transistor is connected to the first node.

4. The shift register unit according to claim 2, wherein the input module comprises a third transistor, where a control terminal of the third transistor is connected to the second node, a first terminal of the third transistor is connected to the second voltage signal lead, and a second terminal of the third transistor is connected to a first terminal of the first capacitor.

5. The shift register unit according to claim 4, wherein the input module further comprises a fourth transistor and a fifth transistor, wherein a control terminal of the fourth transistor is connected to the second clock signal lead, a first terminal of the fourth transistor is connected to the second voltage signal lead, and a second terminal of the fourth transistor is connected to a first terminal of the fifth transistor; and
a control terminal of the fifth transistor is connected to the second node, and a second terminal of the fifth transistor is connected to the first node.

6. The shift register unit according to claim 4, wherein the first control module comprises a sixth transistor, where a control terminal of the sixth transistor is connected to the first clock signal lead, a first terminal of the sixth transistor is connected to the first voltage signal lead, and a second terminal of the sixth transistor is connected to the second node.

7. The shift register unit according to claim 6, wherein the first control module further comprises a seventh transistor, where a control terminal of the seventh transistor is connected to the first voltage signal lead, a first terminal of the seventh transistor is connected to the second node, and a second terminal of the seventh transistor is connected to a second terminal of the second capacitor.

8. The shift register unit according to claim 7, wherein the first control module further comprises an eighth transistor, where a control terminal of the eighth transistor is connected to the input terminal, a first terminal of the eighth transistor is connected to the first clock signal lead, and a second terminal of the eighth transistor is connected to the second node.

9. The shift register unit according to claim 8, wherein the second control module comprises a ninth transistor, where a control terminal of the ninth transistor is connected to a first terminal of the second capacitor and the second clock signal lead, a first terminal of the ninth transistor is connected to the first voltage signal lead, and a second terminal of the ninth transistor is connected to the third node.

10. The shift register unit according to claim 9, wherein the second control module further comprises a tenth transistor, where a control terminal of the tenth transistor is connected to a second terminal of the second capacitor, a first terminal of the tenth transistor is connected to the second terminal of the ninth transistor, and a second terminal of the tenth transistor is connected to the third node.

11. The shift register unit according to claim 10, wherein the third control module comprises an eleventh transistor, where a control terminal of the eleventh transistor is connected to the first node, a first terminal of the eleventh transistor is connected to the second voltage signal lead, and a second terminal of the eleventh transistor is connected to the third node.

12. The shift register unit according to claim 11, further comprising a twelfth transistor, where a control terminal of the twelfth transistor is connected to the first node, a first terminal of the twelfth transistor is connected to the second clock signal lead, and a second terminal of the twelfth transistor is connected to a second terminal of the first capacitor.

13. The shift register unit according to claim 12, wherein the first output module comprises a thirteenth transistor, where a control terminal of the thirteenth transistor is connected to the third node, a first terminal of the thirteenth transistor is connected to the second voltage signal lead, and a second terminal of the thirteenth transistor is connected to the output terminal; and the second output module comprises a fourteenth transistor, where a control terminal of the fourteenth transistor is connected to the first node, a first terminal of the fourteenth transistor is connected to a first voltage signal lead, and a second terminal of the fourteenth transistor is connected to the output terminal.

14. A gate drive circuit, comprising a shift register unit, wherein the shift register unit comprises:

an input module, configured to transmit a signal at an input terminal to a first node in response to a first clock signal;

a first control module, configured to: transmit a first voltage signal to a second node in response to the first clock signal; and transmit the first clock signal to the second node in response to the signal at the input terminal;

a second control module, configured to transmit the first voltage signal to a third node in response to a second clock signal;

a third control module, configured to transmit a second voltage signal to the third node in response to a signal at the first node;

a first output module, configured to transmit the second voltage signal to an output terminal in response to a signal at the third node;

a second output module, configured to transmit the first voltage signal to the output terminal in response to the signal at the first node;

a first capacitor connected between the first node and a second voltage signal lead;

a second capacitor connected between a second clock signal lead and the second node; and a third capacitor connected between the second voltage signal lead and the third node.

15. A display device, comprising a gate drive circuit, wherein the gate drive circuit comprises a shift register unit, and the shift register unit comprises:

an input module, configured to transmit a signal at an input terminal to a first node in response to a first clock signal;

a first control module, configured to: transmit a first voltage signal to a second node in response to the first clock signal; and transmit the first clock signal to the second node in response to the signal at the input terminal;

a second control module, configured to transmit the first voltage signal to a third node in response to a second clock signal;

a third control module, configured to transmit a second voltage signal to the third node in response to a signal at the first node;

a first output module, configured to transmit the second voltage signal to an output terminal in response to a signal at the third node;

a second output module, configured to transmit the first voltage signal to the output terminal in response to the signal at the first node;

a first capacitor connected between the first node and a second voltage signal lead;

a second capacitor connected between a second clock signal lead and the second node; and a third capacitor connected between the second voltage signal lead and the third node.

16. The gate drive circuit according to claim 14, wherein the input module comprises a first transistor, where a control terminal of the first transistor is connected to a first clock signal lead, a first terminal of the first transistor is connected to the input terminal, and a second terminal of the first transistor is connected to the first node.

17. The gate drive circuit according to claim 16, wherein the input module further comprises a second transistor, where a control terminal of the second transistor is connected to a first voltage signal lead, a first terminal of the second transistor is connected to the second terminal of the first transistor, and a second terminal of the second transistor is connected to the first node.

18. The gate drive circuit according to claim 16, wherein the input module comprises a third transistor, where a control terminal of the third transistor is connected to the second node, a first terminal of the third transistor is connected to the second voltage signal lead, and a second terminal of the third transistor is connected to a first terminal of the first capacitor.

19. The gate drive circuit according to claim 18, wherein the input module further comprises a fourth transistor and a fifth transistor, wherein a control terminal of the fourth transistor is connected to the second clock signal lead, a first terminal of the fourth transistor is connected to the second voltage signal lead, and a second terminal of the fourth transistor is connected to a first terminal of the fifth transistor; and a control terminal of the fifth transistor is connected to the second node, and a second terminal of the fifth transistor is connected to the first node.

20. The gate drive circuit according to claim 18, wherein the first control module comprises a sixth transistor, where a control terminal of the sixth transistor is connected to the first clock signal lead, a first terminal of the sixth transistor is connected to the first voltage signal lead, and a second terminal of the sixth transistor is connected to the second node.

* * * * *